(12) United States Patent
Park et al.

(10) Patent No.: US 12,512,078 B2
(45) Date of Patent: Dec. 30, 2025

(54) DISPLAY DEVICE

(71) Applicant: SAMSUNG DISPLAY CO., LTD., Yongin-si (KR)

(72) Inventors: Jun Hyun Park, Suwon-si (KR); Dong Woo Kim, Yongin-si (KR); Sung-Jae Moon, Seongnam-si (KR); An Su Lee, Seoul (KR); Kang Moon Jo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 199 days.

(21) Appl. No.: 16/596,860

(22) Filed: Oct. 9, 2019

(65) Prior Publication Data

US 2020/0118508 A1    Apr. 16, 2020

(30) Foreign Application Priority Data

Oct. 10, 2018  (KR) ........................ 10-2018-0120303

(51) Int. Cl.
*G09G 3/36* (2006.01)
*H10D 86/40* (2025.01)
(Continued)

(52) U.S. Cl.
CPC ......... *G09G 3/3677* (2013.01); *H10D 86/441* (2025.01); *H10D 86/471* (2025.01);
(Continued)

(58) Field of Classification Search
CPC ......... G09G 3/3677; G09G 2300/0842; G09G 2320/0233; H01L 27/124; H01L 27/1251;
(Continued)

(56) References Cited

U.S. PATENT DOCUMENTS 9,324,740 B2    4/2016  Lee et al.
9,842,864 B2   12/2017  Kim et al.
(Continued)

FOREIGN PATENT DOCUMENTS

CN    104733499 A    6/2015
CN    105470262 A    4/2016
(Continued)

OTHER PUBLICATIONS

Korean Office Action dated May 9, 2023 in corresponding Korean Application No. 20230309 (10 pages).
(Continued)

*Primary Examiner* — Patrick N Edouard
*Assistant Examiner* — Eboni N Giles
(74) *Attorney, Agent, or Firm* — F. CHAU & ASSOCIATES, LLC

(57) ABSTRACT

A display device includes a lower pattern disposed on a substrate, an active pattern disposed on the lower pattern, a driving voltage line connected to the source region of the active pattern, and a pixel electrode connected to the drain region of the active pattern. The active pattern includes a source region, a channel region, and a drain region and the channel region of the active pattern overlaps the lower pattern in a plan view. The driving voltage line overlaps the lower pattern to form a first capacitor.

13 Claims, 13 Drawing Sheets

(51) Int. Cl.
  *H10D 86/60* (2025.01)
  *H10H 29/14* (2025.01)
  *H10K 59/121* (2023.01)
  *H10K 59/131* (2023.01)
(52) U.S. Cl.
  CPC ........... *H10D 86/481* (2025.01); *H10D 86/60* (2025.01); *G09G 2300/0842* (2013.01); *G09G 2320/0233* (2013.01); *H10H 29/142* (2025.01); *H10K 59/1213* (2023.02); *H10K 59/1216* (2023.02); *H10K 59/131* (2023.02)
(58) Field of Classification Search
  CPC ............... H01L 27/1255; H01L 27/156; H01L 27/3262; H01L 27/3265; H01L 27/3276
  See application file for complete search history.

(56) References Cited

U.S. PATENT DOCUMENTS

| | | | |
|---|---|---|---|
| 9,941,169 B2 | 4/2018 | Lee et al. | |
| 9,960,194 B1* | 5/2018 | Park | G02F 1/13452 |
| 10,263,053 B2 | 4/2019 | Beak et al. | |
| 10,297,617 B2 | 5/2019 | Yang et al. | |
| 10,497,812 B2 | 12/2019 | Lee et al. | |
| 10,629,488 B2 | 4/2020 | Lee et al. | |
| 10,985,068 B2 | 4/2021 | Lee et al. | |
| 2004/0135496 A1* | 7/2004 | Park | H10K 59/88 313/504 |
| 2008/0309653 A1* | 12/2008 | Takahashi | G09G 3/3233 345/211 |
| 2010/0149128 A1* | 6/2010 | No | G06F 3/0447 345/174 |
| 2014/0145197 A1* | 5/2014 | Wang | G02F 1/136213 257/71 |
| 2015/0015468 A1* | 1/2015 | Ko | G09G 3/3233 345/82 |
| 2016/0079330 A1* | 3/2016 | Oh | H10K 59/1216 438/23 |
| 2016/0093647 A1* | 3/2016 | Kim | H10D 30/6723 257/40 |
| 2016/0260792 A1* | 9/2016 | Kim | H10K 59/35 |
| 2016/0372497 A1* | 12/2016 | Lee | H01L 27/1255 |
| 2017/0358262 A1* | 12/2017 | Moon | G09G 3/3225 |
| 2018/0069069 A1* | 3/2018 | Ebisuno | H10K 59/352 |
| 2018/0145123 A1* | 5/2018 | Kim | G09G 3/3233 |

FOREIGN PATENT DOCUMENTS

| | | |
|---|---|---|
| CN | 107887413 A | 4/2018 |
| JP | 2017-173505 | 9/2017 |
| KR | 10-2013-0001513 A | 1/2013 |
| KR | 10-2015-0011868 | 2/2015 |
| KR | 10-2015-0078347 | 7/2015 |
| KR | 10-2016-0005814 | 1/2016 |
| KR | 10-2016-0055670 | 5/2016 |
| KR | 10-2016-0078606 | 7/2016 |
| KR | 10-2017-0140828 | 12/2017 |

OTHER PUBLICATIONS

Office Action dated Jun. 27, 2024 in corresponding Chinese Patent Application No. 201910953782.3 (in Chinese), 6 pages.
Notice of Allowance dated May 7, 2024 in corresponding Korean Patent Application No. 10-2018-0120303 (7 pages).

* cited by examiner

DISPLAY DEVICE

CROSS-REFERENCE TO RELATED APPLICATION

This application claims priority to and the benefit of Korean Patent Application No. 10-2018-0120303 filed in the Korean Intellectual Property Office on Oct. 10, 2018, the entire contents of which are incorporated by reference herein.

BACKGROUND

(a) Technical Field

The present disclosure relates to a display device; more particularly, a display device having a capacitor formed by at least a driving voltage line.

(b) Description of the Related Art

A display device is a device for displaying an image, and recently, a light emitting diode display has attracted attention as a self-light emission display device.

The light emitting diode display has a self-emission characteristic without a separate light source, differently from the liquid crystal display, so that thickness and weight thereof may be reduced. Further, the light emitting diode display shows high quality characteristics such as low power consumption, high luminance, and high response speed.

In general, the light emitting diode display includes a substrate, a plurality of thin film transistors disposed on the substrate, a plurality of insulating layers disposed between wires configuring the thin film transistor, and a light-emitting device connected to the thin film transistor, and for example, the light-emitting device may include an organic light emitting element.

The above information disclosed in this Background section is only for enhancement of understanding of the background of the invention and therefore it may contain information that does not form the prior art that is already known in this country to a person of ordinary skill in the art.

SUMMARY

According to an exemplary embodiment of the present inventive concept, a display device includes a lower pattern disposed on a substrate, an active pattern disposed on the lower pattern, a driving voltage line connected to the source region of the active pattern, and a pixel electrode connected to the drain region of the active pattern. The active pattern includes a source region, a channel region, and a drain region and the channel region of the active pattern overlaps the lower pattern in a plan view. The driving voltage line overlaps the lower pattern to form a first capacitor.

According to an exemplary embodiment of the present inventive concept, a display device includes a first conductive layer including a lower pattern on a substrate, a first insulating layer on the first conductive layer, an active pattern disposed on the first insulating layer and including a source region, a channel region, and a drain region, a second conductive layer disposed on the active pattern and including a gate electrode overlapping the channel region, a second insulating layer disposed on the second conductive layer, a third conductive layer disposed on the second insulating layer and including a driving voltage line and a data line separated from the driving voltage line, a third insulating layer disposed on the third conductive layer, a pixel electrode layer including a first pixel electrode disposed on the third insulating layer, a fourth conductive layer disposed between the third insulating layer and the pixel electrode layer, and a fourth insulating layer disposed between the fourth conductive layer and the pixel electrode layer. The fourth conductive layer includes a first contact member disposed on an end portion of the data line to be in contact with the end portion.

According to an exemplary embodiment of the present inventive concept, a display device includes a first scan line and a second scan line, a driving gate electrode disposed between the first scan line and the second scan line, a data line, a driving voltage line, an initialization voltage line, and a common voltage line crossing the first and second scan lines, a first transistor electrically connected to the driving voltage line and the driving gate electrode, a second transistor electrically connected to the first scan line and the data line, a third transistor electrically connected to the second scan line, the first transistor, and the initialization voltage line, a capacitor electrode electrically connected to a drain region of the first transistor, a light emitting diode (LED) electrically connected to the capacitor electrode; and a lower pattern overlapping a channel region of the first transistor in a plan view. The lower pattern is electrically connected to the capacitor electrode and the lower pattern overlaps at least one among the driving voltage line, the initialization voltage line, and the common voltage line in the plan view to form a first capacitor.

DETAILED DESCRIPTION OF THE EMBODIMENTS

Figure 1:
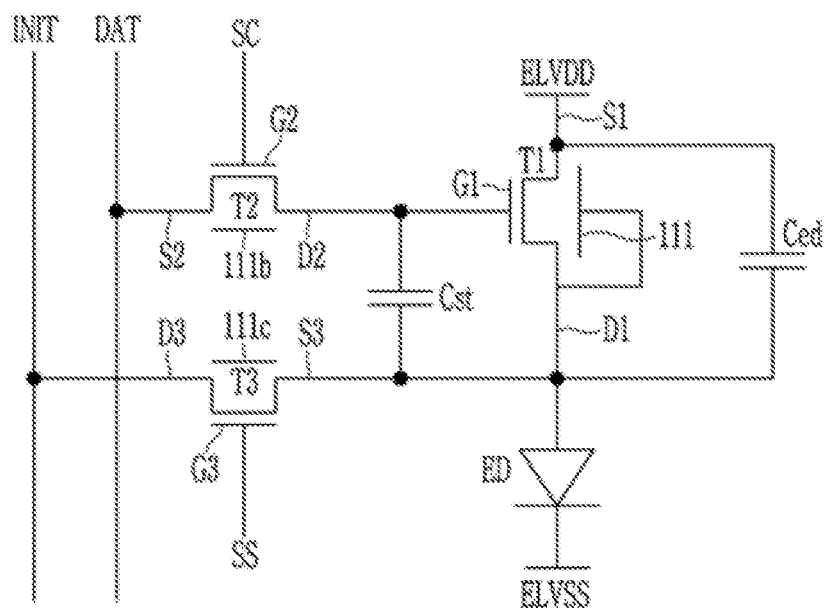
FIG. 1 is a circuit diagram of one pixel of a display device according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive, and like reference numerals designate like elements throughout the specification.

Further, in the drawings, size and thickness of each element are arbitrarily illustrated for convenience of description, and the present invention is not necessarily limited to those illustrated in the drawings. In the drawings, the thickness of layers, films, panels, regions, etc., are exaggerated for clarity. In the drawings, the thicknesses of a layer and a region are exaggerated for convenience of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Throughout this specification and the claims which follow, a plan view means a view when observing a surface parallel to two directions (e.g., a direction DR1 and a direction DR2) crossing each other, and a cross-sectional view means a view when observing a surface cut in a direction (e.g., a direction DR3) perpendicular to the surface parallel to the direction DR1 and the direction DR2. Also, to overlap two constituent elements means that two constituent elements are overlapped in the direction DR3 (e.g., a direction perpendicular to an upper surface of the substrate) unless stated otherwise.

FIG. 1 is a circuit diagram of one pixel of a display device according to an exemplary embodiment.

Referring to FIG. 1, a display device according to an exemplary embodiment includes a plurality of pixels, and one pixel includes a plurality of transistors T1, T2, and T3, a storage capacitor Cst, and at least one light emitting diode (LED) ED. In the present exemplary embodiment, an example is described in which one pixel includes one light emitting diode (LED) ED.

The plurality of transistors T1, T2, and T3 include a first transistor T1, a second transistor T2, and a third transistor T3. The terms source electrode and drain electrode described below are for differentiating two electrodes disposed on respective sides of a channel of each of the transistors T1, T2, and T3, and the two terms may be used interchangeably.

A gate electrode G1, of the first transistor T1 is connected to a first terminal of the storage capacitor Cst, a source electrode S1 of the first transistor T1 is connected to a driving voltage line transmitting a driving voltage ELVDD, and a drain electrode D1 of the first transistor is connected to the anode of the light emitting diode (LED) ED and a second terminal of the storage capacitor Cst. The first transistor may receive a data voltage DAT depending on a switching operation of the second transistor T2 to charge the storage capacitor Cst and then may supply a driving current to the light emitting diode (LED) ED depending on the voltage stored in the storage capacitor Cst.

A gate electrode G2 of the second transistor T2 is connected to a first scan line transmitting a first scan signal SC, a source electrode S2 of the second transistor T2 is connected to a data line transmitting the data voltage DAT or a reference voltage, and a drain electrode D2 of the second transistor T2 is connected to the first terminal of the storage capacitor Cst and the gate electrode G1 of the first transistor T1. The second transistor T2 may be turned on depending on the first scan signal SC to transmit the reference voltage or the data voltage DAT to the gate electrode G2 of the first transistor T2 and the first terminal of the storage capacitor Cst.

A gate electrode G3 of the third transistor T3 is connected to a second scan line transmitting a second scan signal SS, a source electrode S3 of the third transistor T3 is connected to the second terminal of the storage capacitor Cst, the drain electrode D1 of the first transistor T1, and the anode of the light emitting diode (LED) ED, and a drain electrode D3 of the third transistor T3 is connected to an initialization voltage line transmitting an initialization voltage INIT. The third transistor T3 may be turned on depending on the second scan signal SS to transmit the initialization voltage INIT to the anode of the light emitting diode (LED) ED and the second terminal of the storage capacitor Cst, thereby initializing the voltage of the anode of the light emitting diode (LED) ED.

The first terminal of the storage capacitor Cst is connected to the gate electrode G1 of the first transistor T1, and the second terminal is connected to the source electrode S3 of the third transistor T3 and the anode of the light emitting diode (LED) ED. The cathode of the light emitting diode (LED) ED is connected to a common voltage line transmitting a common voltage ELVSS.

The display device further includes a hold transistor Ced electrically connected between the anode of the LED ED and a driving voltage line (172a in FIG. 2) receiving the driving voltage ELVDD. For example, a first terminal of the hold transistor Ced is electrically connected to the anode of the LED ED and a second terminal of the hold transistor Ced is electrically connected to the driving voltage line that is electrically connected to the source electrode S1 of the first transistor T1. In an exemplary embodiment, the hold capacitor Ced may serve to minimize any fluctuation of a voltage at the anode of the LED ED, thereby maintaining the voltage at the anode constant.

The light emitting diode (LED) ED may emit light depending on the driving current of the first transistor T1.

An example of the operation of the circuit shown in FIG. 1, particularly, an example of the operation during one frame, will be described. In this example, the transistors T1, T2, and T3 are N-channel transistors. The present inventive concept is not limited thereto. For example, the transistors T1, T2 and T3 may be P-channel transistors.

For the convenience of description, the one frame may start with an initialization period during which the first scan signal SC of a high level and the second scan signal SS of a high level are supplied to turn on the second transistor T2 and the third transistor T3. The reference voltage from the data line is supplied to the gate electrode G1 of the first transistor T1 and the first terminal of the storage capacitor Cst through the turned-on second transistor T2, and the initialization voltage INIT is supplied to the drain electrode D1 of the first transistor T1 and the anode of the light emitting diode (LED) ED through the turned-on third transistor T3. Accordingly, during the initialization period, the drain electrode D1 of the first transistor T1 and the anode of the light emitting diode (LED) ED are initialized into the initialization voltage INIT. At this time, the storage capacitor Cst stores a voltage difference between the reference voltage and the initialization voltage INIT.

Next, in a sensing period during which the second scan signal SS becomes a low level, staying at the low level and the first scan signal SC of the high level is maintained, the second transistor T2 maintains the turn-on state and the third transistor T3 is turned off. The gate electrode G1 of the first transistor T1 and the first terminal of the storage capacitor Cst maintain the reference voltage through the turned-on second transistor T2, and the drain electrode D1 of the first transistor T1 and the anode of the light emitting diode (LED) ED are disconnected from the initialization voltage INIT through the turned-off third transistor T3. Accordingly, the first transistor T1 is turned off when the current flows from the source electrode S1 to the drain electrode D1 and then the voltage of the drain electrode D1 becomes "the reference voltage Vth". Vth represents a threshold voltage of the first transistor T1. At this time, the voltage difference between the gate electrode G1 and the drain electrode D1 of the first transistor T1 is stored in the storage capacitor Cst, and the sensing of the threshold voltage Vth of the first transistor T1 is completed. By generating the data signal compensated by reflecting the sensed characteristic information during the sensing period, a characteristic deviation of first transistor T1 which may be different for each pixel may be externally compensated.

Next, in a data input period during which the first scan signal SC of the high level is supplied and the second scan signal SS of the low level is supplied, the second transistor T2 is turned on and the third transistor T3 is turned off. The data voltage DAT from the data line is supplied to the first terminal of the storage capacitor Cst and the gate electrode G1 of the first transistor T1 via the second turned-on transistor T2. In this case, the anode of the drain electrode D1 and the light emitting diode (LED) ED of the first transistor may substantially maintain the potential in the sensing period by the first transistor T1 in the turn-off state.

Next, in a light emission period during which the first transistor T1 turned on by the data voltage DAT transmitted to the gate electrode G1 generates the driving current according to the data voltage DAT, and the light emitting diode (LED) ED may be emitted by the driving current.

Figure 2:
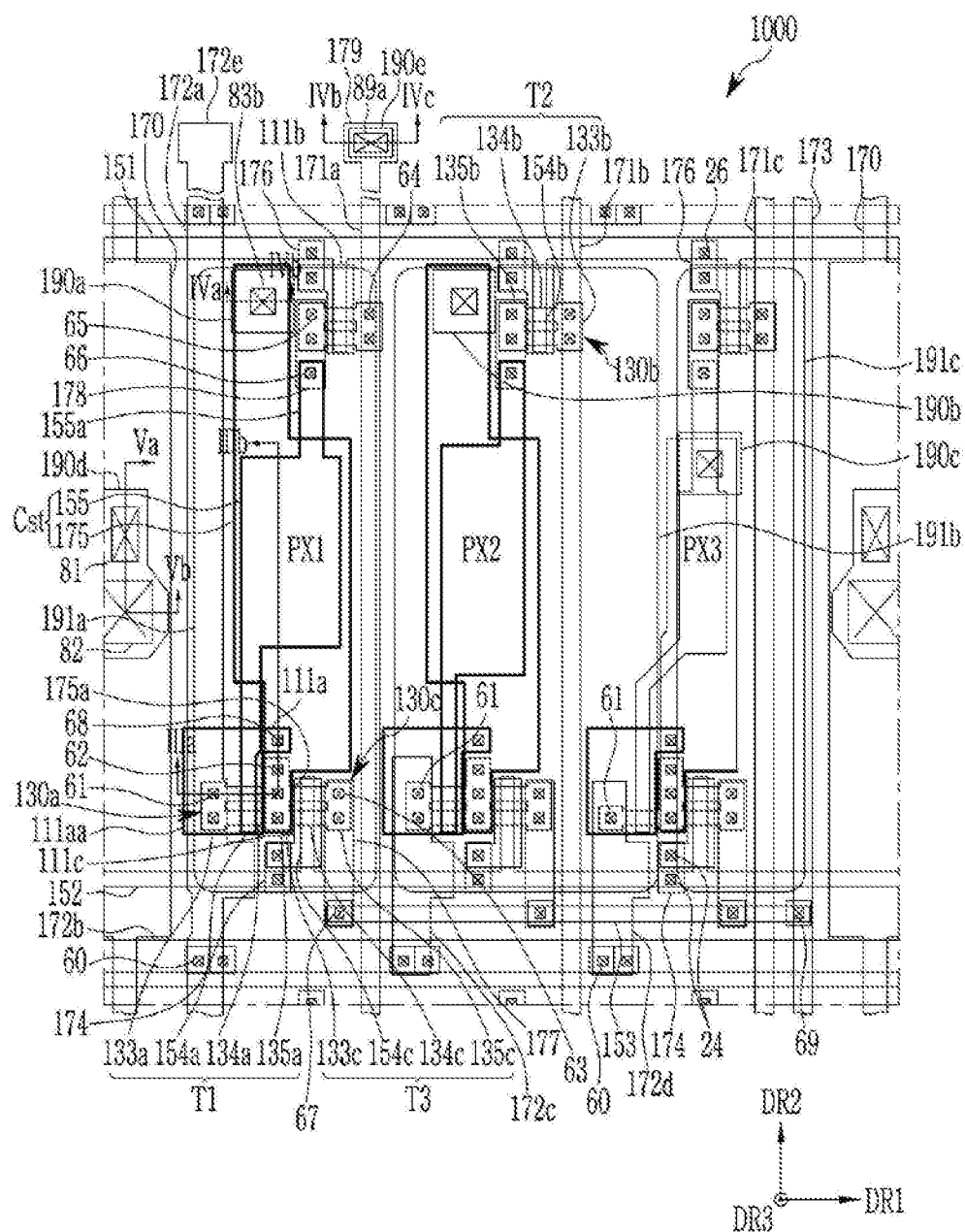
FIG. 2 is a plan layout view of a plurality of pixels of a display device according to an exemplary embodiment.
Figure 3:
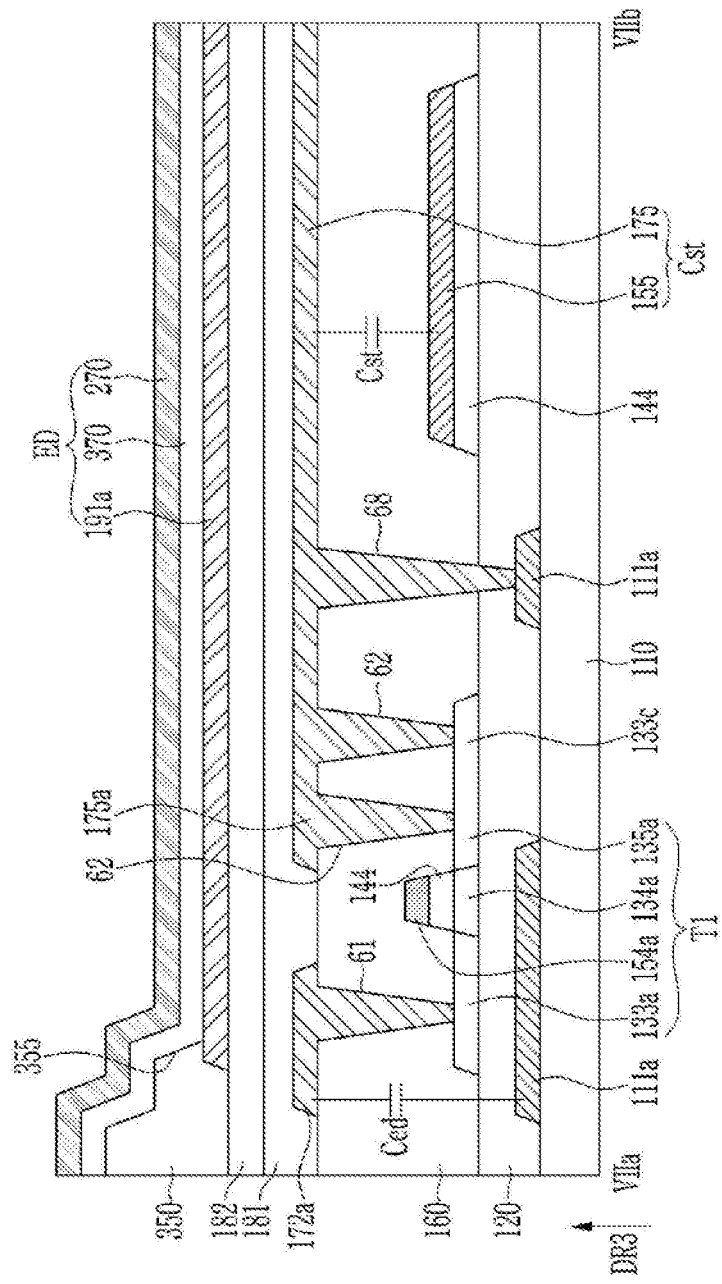
FIG. 3 is a cross-sectional view of a display device shown in FIG. 2 taken along line IIIa-IIIb.
Figure 4:
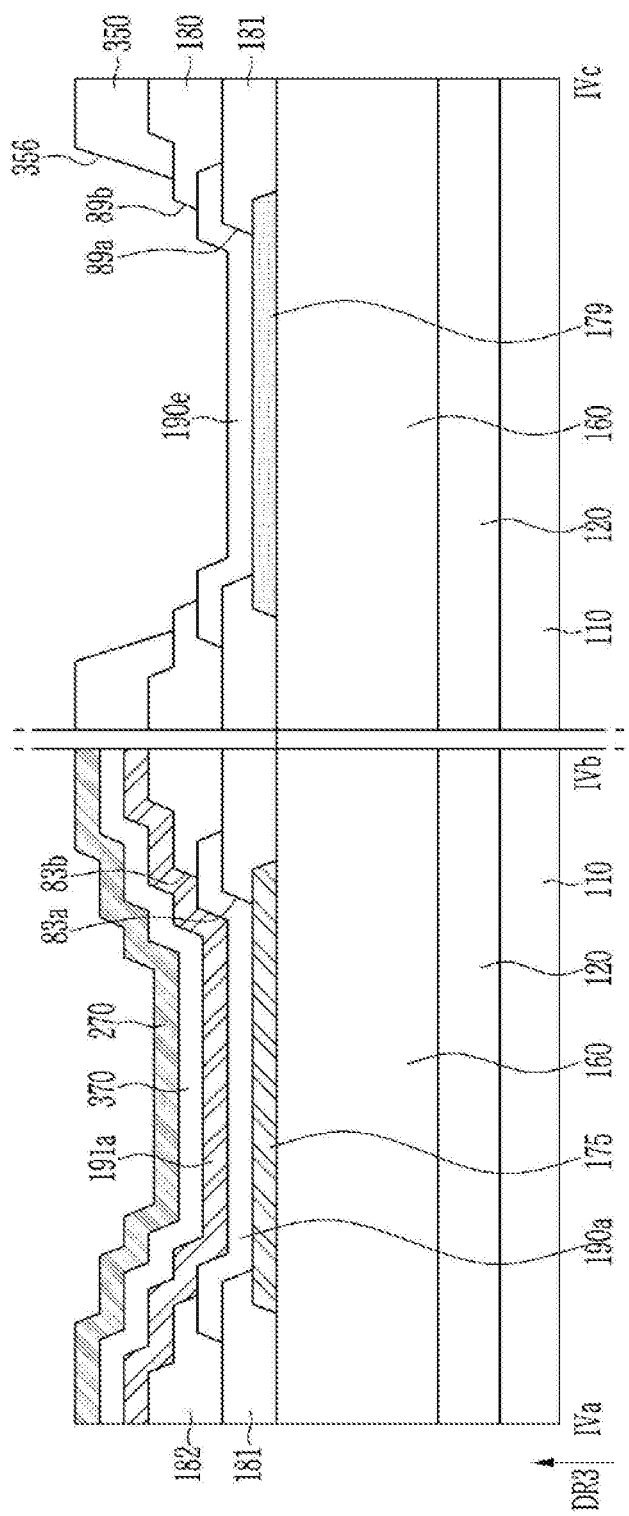
FIG. 4 is a cross-sectional view of a display device shown in FIG. 2 taken along lines IVa-IVb and IVb-IVc.
Figure 5:
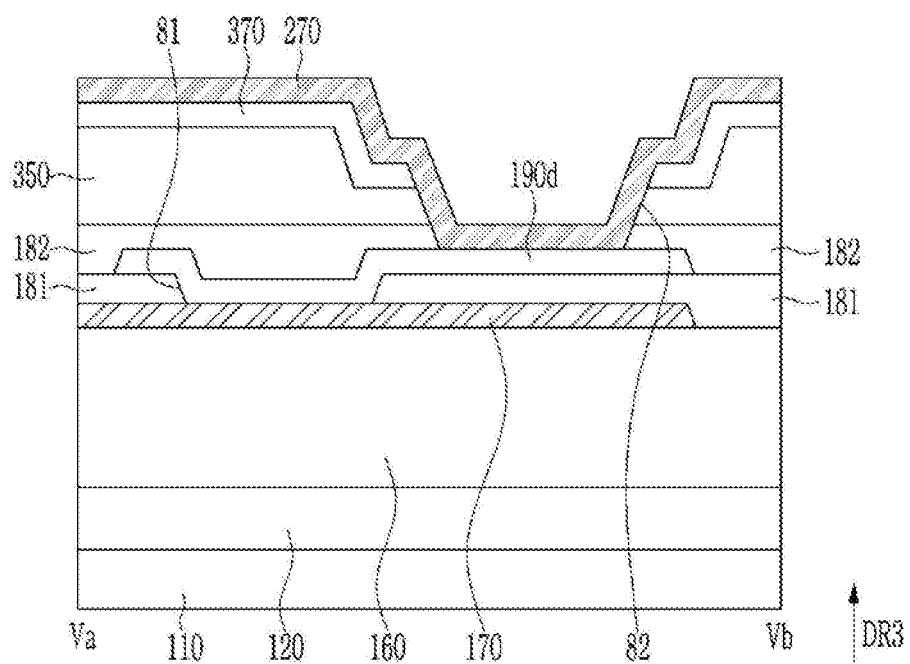
FIG. 5 is a cross-sectional view of a display device shown in FIG. 2 taken along line Va-Vb.
Figure 6:
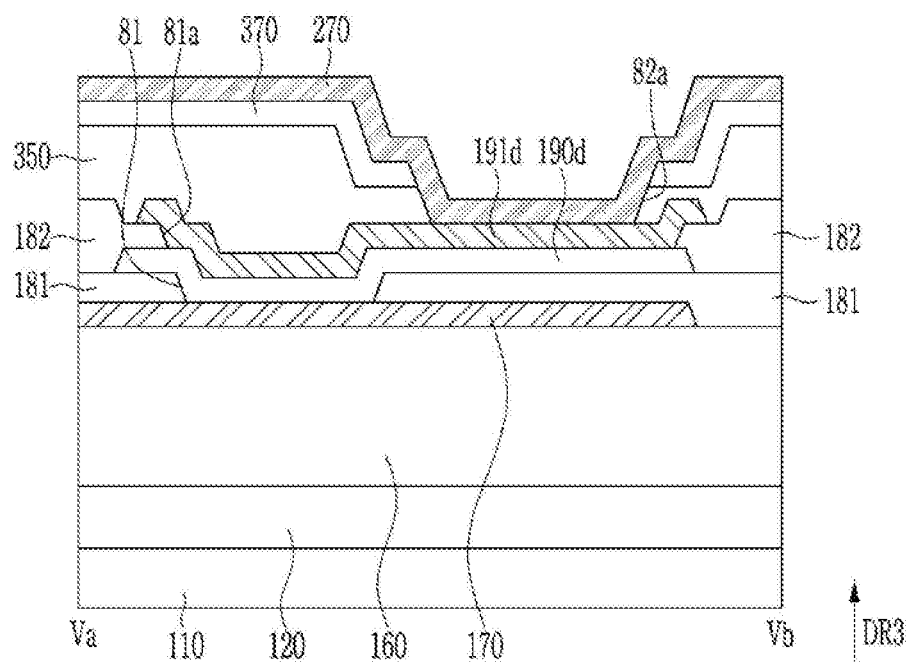
FIG. 6 is another exemplary cross-sectional view of a display device shown in FIG. 2 taken along line Va-Vb.

FIG. 2 is a plane layout view of a plurality of pixels of a display device according to an exemplary embodiment, FIG. 3 is a cross-sectional view of a display device shown in FIG. 2 taken along line IIIa-IIIb, FIG. 4 is a cross-sectional view of a display device shown in FIG. 2 taken along lines IVa-IVb and IVb-IVc, FIG. 5 is a cross-sectional view of a display device shown in FIG. 2 taken along line Va-Vb, and FIG. 6 is another exemplary cross-sectional view of a display device shown in FIG. 2 taken along line Va-Vb.

The display device 1000 may include three pixels PX1, PX2, and PX3, for example. In a plan view, each of the three pixels PX1, PX2 and PX3 may be defined in a region where the plurality of transistors T1, T2, and T3, and a storage capacitor Cst of FIG. 1 are disposed for each of the pixels PX1, PX2 and PX3, A light emitting area may be defined as the area of the light emitting diode (LED) ED of FIG. 1 where light is emitted for each of the pixels PX1, PX2 and PX3. The light emitting area for each of the pixels PX1, PX2 and PX3 overlaps a pixel electrode of the corresponding light emitting diode (LED) ED of FIG. 1, which is located on a layout of FIG. 2, for example. In an exemplary embodiment, the light emitting area of the three pixels PX1, PX2 and PX3 may emit a red light, a green light and a blue light, respectively. An area of the pixel electrode 191b, an area of the pixel electrode 191a, and an area of the pixel electrode 191c may be reduced in that order.

The display device 1000 according to an exemplary embodiment may include a substrate 110. The substrate 110 may include an insulating material such as glass, plastic, and the like, and may have flexibility.

A barrier layer as an insulating layer may be disposed on the substrate 110 and an underlying layer including a plurality of lower patterns 111a, 111b, and 111c as a first conductive layer may be disposed thereon. The underlying layer may be conductive. For example, the underlying layer may include a semiconductor material including various conductive metals or having equivalent conductive characteristics.

A buffer layer 120 is disposed on the underlying layer. The buffer layer 120 may include an insulating layer. The underlying layer may be disposed between the substrate 110 and the buffer layer 120.

An active layer including a plurality of active patterns 130a, 130b, and 130c is disposed on the buffer layer 120. The underlying layer may be disposed between the substrate 110 and the active layer. The active patterns 130a, 130b, and 130c may be disposed in the pixels PX1, PX2, and PX3, respectively, and may include channel regions 134a, 134b, and 134c, respectively. The channel regions 134a, 134b and 134c may form channels of the transistors T1, T2, and T3 as above-described, respectively. Each of the active patterns 130a, 130b and 130c may further include a conductive region connected to a corresponding channel of the transistors T1, T2 and T3. For example, the conductive region of the active patterns 130a, 130b, and 130c includes source regions 133a, 133b, and 133c and drain regions 135a, 135b, and 135c of each of the transistors T1, T2, and T3. The active pattern 130a of the first transistor T1 and the active pattern 130c of the third transistor T3 may be connected to each other.

The active layer may include a semiconductor material such as an amorphous silicon, a polysilicon, an oxide semiconductor, or the like.

An insulating pattern 144 of a first insulating layer is disposed on the active layer. Particularly, the insulating pattern 144 may overlap the channel regions 134a, 134b, and 134c of the active patterns 130a, 130b, and 130c and may be disposed on the channel regions 134a, 134b, and 134c. The insulating pattern 144 need not substantially overlap the conductive regions of the active patterns 130a, 130b, and 130c.

A second conductive layer may be disposed on the insulating pattern 144. The second conductive layer may include a first scan line 151 transmitting the first scan signal SC as above-described, a second scan line 152 transmitting the second scan signal SS, a transverse initialization voltage line 153 transmitting the initialization voltage a transverse driving voltage line 172b transmitting the driving voltage ELVDD, a driving gate electrode 155, a first gate electrode 154a connected to the driving gate electrode 155, a second gate electrode 154b, a third gate electrode 154c, and the like. The gate electrode G1, the gate electrode G2, and the gate electrode G3 in the above-described circuit diagram respectively correspond to the first gate electrode 154a, the second gate electrode 154b, and the third gate electrode 154c.

The first and second scan lines 151 and 152, the transverse initialization voltage line 153, and the transverse driving voltage line 172b may extend in the first direction DR1. The driving gate electrode 155 may be disposed between the first scan line 151 and the second scan line 152. The second gate electrode 154b is connected to the first scan line 151 and may have a shape that is protruded down from the first scan line 151. The third gate electrode 154c is connected to the second scan line 152 and may have a shape that is protruded above from the second scan line 152.

The driving gate electrode 155 disposed in each pixel PX1, PX2, and PX3 may include an extension 155a protruded upwardly and approximately extending in the second direction DR2. In the first and second pixels PX1 and PX2, the first gate electrode 154a may be protruded downwardly from the driving gate electrode 155 and approximately extending in the second direction DR2, in the third pixel PX3, the first gate electrode 154a may be folded at least twice at a portion connected to the driving gate electrode 155. For example, the first gate electrode 154a of the third pixel PX3, unlike in the first and second pixels of PX1 and PX2, may be slanted downwardly from the driving gate electrode 155 and then protruded downwardly in the second direction D2.

The first gate electrode 154a crosses the active pattern 130a and overlaps the channel region 134a of the active pattern 130a. The second gate electrode 154b crosses the active pattern 130b and overlaps the channel region 134b of the active pattern 130b. The third gate electrode 154c crosses the active pattern 130c and overlaps the channel region 134c of the active pattern 130c.

A second insulating layer 160 may be disposed on the second conductive layer. The buffer layer 120 and/or the second insulating layer 160 may include a plurality of contact holes 24, 26, 60, 61, 62, 63, 64, 65, 66, 67, 68, and 69.

A third conductive layer may be disposed on the second insulating layer 160. The third conductive layer may include a plurality of data lines 171a, 171b, and 171c, a driving voltage line 172a, a common voltage line 170, an initialization voltage line 173, a capacitor electrode 175, a plurality of connecting members 174, 176, 177, and 178, and a plurality of driving voltage patterns 172c and 172d.

The data lines 171a, 171b, and 171c, the driving voltage line 172a, the common voltage line 170, the initialization voltage line 173, and the driving voltage patterns 172c and 172d extend substantially in the second direction DR2 to be elongated, thereby crossing the first scan line 151 and the second scan line 152.

A plurality of pixels PX1, PX2, and PX3 repeated in FIG. 2 as one group may be arranged in the first direction DR1 and adjacent to each other. The common voltage line 170 may be disposed at both of right and left sides of the plurality of pixels PX1, PX2, and PX3 of one group. That is, the common voltage line 170 may be formed for each of a plurality of pixels PX1, PX2, and PX3 of one repeated group. When the plurality of pixels PX1, PX2, and PX3 of one repeated group include three pixels PX1, PX2, and PX3, the data lines 171a, 171b, and 171c, at least one driving voltage line 172a, and at least one initialization voltage line 173 may be disposed between two adjacent common voltage lines 170.

Each data line 171a, 171b, and 171c is electrically connected to the source region 133b of the active pattern 130b through at least one contact hole 64 (FIG. 2 shows two contact holes 64 in each pixel PX1, PX2, and PX3) of the second insulating layer 160.

FIG. 2 shows an end portion 179 for one data line 171a, but each of the data lines 171a, 171b, and 171c may include such an end portion. The end portion 179 may be disposed in a pad region disposed at the edge of the display device.

The driving voltage line 172a is extended through the first pixel PX1 in the second direction DR2. The driving voltage patterns 172c and 172d may overlap the second pixel PX2. The driving voltage pattern 172d partially overlaps the third pixel PX3. For example, the driving voltage line 172a overlaps the pixel electrode 191a of the first pixel PX1; the driving voltage pattern 172c may overlaps the pixel electrode 191b of the second pixel PX2; and the driving voltage pattern 172d overlaps both the pixel electrode 191b of the second pixel PX2 and the pixel electrode 191c of the third pixel PX3. The driving voltage pattern 172d overlaps the pixel electrode 191b of the pixel. PX2 without being electrically connected to the first transistor T1 of the second pixel PX2. Instead, the driving voltage pattern 172d may be electrically connected to the first transistor T1 of the third pixel PX3. The driving voltage line 172a may be extended through the first pixel PX1 in the second direction DR2. The driving voltage patterns 172c and 172d may be partially extended into the second pixel PX2 without crossing through the second pixel PX2. Like the data line 171a, the driving voltage line 172a may include an end portion 172e disposed in the pad region.

The driving voltage line 172a and the driving voltage patterns 172c and 172d are electrically connected to the source region 133a of the active pattern 130a through at least one contact hole 61 (FIG. 2 shows two contact holes 61 of the pixels PX1 and PX2 and one contact hole 61 of the pixel PX3) of the second insulating layer 160. Also, the driving voltage line 172a and the driving voltage patterns 172c and 172d are electrically connected to the transverse driving voltage line 172b through at least one contact hole 60 (FIG. 2 shows two contact holes 60 of each pixel PX1, PX2, and PX3) of the second insulating layer 160. Therefore, the transverse driving voltage line 172b and the driving voltage patterns 172c and 172d may transmit the driving voltage ELVDD together with the driving voltage line 172a, and the driving voltage ELVDD in the entire display device may be transmitted in a mesh shape in both of the first direction DR1 and the second direction DR2.

The initialization voltage line 173 is electrically connected to the transverse initialization voltage line 153 through the contact hole 69 of the second insulating layer 160. For example, the initialization voltage line 173 is shared by the three pixels PX1, PX2 and PX3 using the transverse initialization voltage line 153. The transverse initialization voltage line 153 may transfer the initialization voltage INIT along with the initialization voltage line 173. For example, the initialization voltage line 173 is formed for each of the three pixels PX1, PX2, and PX3. The initialization voltage INIT received by the initialization voltage line 173 may be transmitted to all pixels PX1, PX2, and PX3 through the transverse initialization voltage line 153.

The capacitor electrode 175 may be placed within each pixel PX1, PX2, and PX3. The capacitor electrode 175 may overlap the majority of the corresponding driving gate electrode 155 and the second insulating layer 160 may be disposed therebetween. For example, the capacitor electrode 175 may have a maximum width greater than that of the driving gate electrode 155. The maximum width of each of the capacitor electrode 175 and the driving gate electrode 155 may be measured in the first direction DR1. The capacitor electrode 175, the driving gate electrode 155 and the second insulating layer 160 disposed therebetween may form the storage capacitor Cst.

The capacitor electrode 175 may include a portion having a maximum width measured in the first direction DR1 and a connection 175a having a width smaller than the maximum width of the capacitor electrode 175. The connection 175a may be protruded downwardly from the portion of the capacitor electrode 175 having the maximum width of the capacitor electrode 175. The connection 175a is electrically connected to the drain region 135a of the active pattern 130a and the source region 133c of the active pattern 130c connected thereto through at least one contact hole 62 (FIG. 2 shows three contact holes 62 of each pixel PX1, PX2, and PX3) of the second insulating layer 160. Also, the capacitor electrode 175 is electrically connected to the lower pattern 111a via the contact hole 68 of the second insulating layer 160 and the buffer layer 120.

The connecting member 174 is electrically connected to the second scan line 152 and the lower pattern 111c via two contact holes 24 of the buffer layer 120 and the second insulating layer 160, or just the second insulating layer 160 so that the second scan line 152 may be electrically connected to the lower pattern 111c.

The connecting member 176 is electrically connected to the first scan line 151 and the lower pattern 111b via two contact holes 26 of the buffer layer 120 and the second insulating layer 160, or just the second insulating layer 160 so that the first scan line 151 may be electrically connected to the lower pattern 111b.

The connecting member 177 is electrically connected to the drain region 135c of the active pattern 130c via at least one contact hole 63 (FIG. 2 shows two contact holes 63 in each pixel PX1, PX2, and PX3) of the second insulating layer 160 in each pixel PX1, PX2, and PX3, and is electrically connected to the transverse initialization voltage line 153 via the contact hole 67 of the second insulating layer 160 so that the drain region 135c of the active pattern 130c may be electrically connected to the transverse initialization voltage line 153.

The transverse initialization voltage line 153 extends in the first direction DR1 throughout three pixels PX1, PX2, and PX3, however it may be disposed between two adjacent common voltage lines 170 without crossing the two common voltage lines 170. The transverse initialization voltage line 153 crosses three adjacent data lines 171a, 171b, and 171c, and may extend only to the initialization voltage line 173.

The connecting member 178 is electrically connected to the drain region 135b of the active pattern 130b via at least one contact hole 65 (FIG. 2 shows two contact holes 65 in each pixel PX1, PX2, and PX3) of the second insulating layer 160 in each pixel PX1, PX2, and PX3, and is electrically connected to the extension 155a of the driving gate electrode 155 via the contact hole 66 of the second insulating layer 160 so that the drain region 135b of the active pattern 130b and the extension 155a of the driving gate electrode 155 may be electrically connected to each other.

At least one of the first conductive layer, the second conductive layer, and the third conductive layer may include at least one among metals such as copper, aluminum, magnesium, silver, gold, platinum., palladium, nickel (Ni), neodymium (Nd), iridium (Ir), molybdenum (Mo), tungsten (W), titanium (Ti), chromium (Cr), tantalum, alloys thereof, and the like. Each of the first conductive layer, the second conductive layer, and the third conductive layer may include a single layer or multiple layers.

For example, the third conductive layer may have a multilayer structure including the underlying layer including titanium and the overlying layer including copper.

The first transistor T1 includes the channel region 134a, the source region 133a, the drain region 135a, and the first gate electrode 154a. The source region 133a of the first transistor T1 is electrically connected to the driving voltage line 172a and the driving voltage patterns 172c and 172d, thereby receiving the driving voltage ELVDD.

The lower pattern 111a corresponding to the first transistor T1 overlaps the channel region 134a of the first transistor T1 and is disposed between the channel region 134a of the first transistor T1 and the substrate 110. The lower pattern 111a may serve to prevent external light from reaching the channel region 134a, thereby reducing a leakage current and a characteristic deterioration. The lower pattern 111a is electrically connected to the drain region 135a of the first transistor T1 through the capacitor electrode 175.

The second transistor T2 includes the channel region 134b, the source region 133b, the drain region 135b, and the second gate electrode 154b. The source region 133b of the second transistor T2 is electrically connected to the data lines 171a, 171b, and 171c, thereby receiving the data voltage DAT or the reference voltage. The drain region 135b of the second transistor T2 may be electrically connected to the first gate electrode 154a through the driving gate electrode 155.

The lower pattern 111b corresponding to the second transistor T2 overlaps the channel region 134b and is disposed between the channel region 134b of the second transistor T2 and the substrate 110 to prevent the external light from reaching the channel region 134b, thereby reducing the leakage current and the characteristic deterioration. Since the lower pattern 111b is electrically connected to the first scan line 151, the lower pattern 111b may serve as a dual gate electrode of the second transistor T2 with the second gate electrode 154b. For example, the second gate electrode 154b and the lower pattern 111b may serve as a top gate electrode of the second transistor T2 and a bottom gate electrode of the second transistor T2, respectively.

The third transistor T3 includes the channel region 134c, the source region 133c, the drain region 135c, and the third gate electrode 154c. The drain region 135c of the third transistor T3 may receive the initialization voltage INIT from the transverse initialization voltage line 153.

The lower pattern 111c corresponding to the third transistor T3 overlaps the channel region 134c and is disposed between the channel region 134c of the third transistor T3 and the substrate 110 to prevent the external light from reaching the channel region 134c, thereby reducing the leakage current and the characteristic deterioration. Since the lower pattern 111c is electrically connected to the second scan line 152, the lower pattern 111c may serve as a dual gate electrode of the third transistor T3 with the third gate electrode 154c. For example, the third gate electrode 154c and the lower pattern 111c may serve as a top gate electrode of the third transistor T3 and a bottom gate electrode of the third transistor T3, respectively.

A third insulating layer 181 may be disposed on the second insulating layer 160 and the third conductive layer. The third insulating layer 181 may include a contact hole 83a disposed on the capacitor electrode 175, a contact hole 89a disposed on the end portion 179 of the data lines 171a, 171b, and 171c, and a contact hole 81 disposed on the common voltage line 170.

A fourth conductive layer including a plurality of contact members 190a, 190b, 190c, 190d, and 190e may be disposed on the third insulating layer 181.

The contact member 190a, 190b, and 190c may be respectively disposed in the pixels PX1, PX2, and PX3 and in contact with the capacitor electrode 175 via the contact hole 83a to be electrically connected. The contact member 190d may be in contact with the common voltage line 170 via the contact hole 81 to be electrically connected. The contact member 190e may be in contact with the end portion 179 of the data lines 171a, 171b, and 171c via the contact hole 89a to be electrically connected.

The contact members 190a, 190b, 190c, 190d, and 190e may increase the adherence of the capacitor electrode 175 of the third conductive layer, the common voltage line 170, and the end portion 179 of the data lines 171a, 171b, and 171c, which are in contact thereto, with other conductive layers, and may prevent oxidation of the third conductive layer. Particularly, when the upper layer of the third conductive layer includes copper, oxidation of the copper may be prevented. For this, when the upper layer of the third conductive layer includes the conductive material for preventing corrosion of the upper layer of the third conductive layer, for example, copper, the fourth conductive layer may include the conductive material by capping the upper layer of the third conductive layer to prevent the corrosion of copper. For example, the fourth conductive layer may include the conductive material of the metal oxide such as ITO, IZO, and the like.

A fourth insulating layer 182 may be disposed on the third insulating layer 181 and the fourth conductive layer. The fourth insulating layer 182 may include a contact hole 83b disposed on each contact member 190a, 190b, and 190c and overlapping the contact hole 83a and a contact hole 89b disposed on the contact member 190e and overlapping the contact hole 89a. A fifth insulating layer 350 on the fourth insulating layer 182 may include an opening 356 connected to the contact hole 89b.

The contact member 190e may be exposed outside by the contact hole 89b, and thereby may be in electrical contact with a separate driving circuit chip, circuit film, or circuit board. For example, the contact member 190e may be externally exposed through the contact holes 89b and the opening 356 connected to each other so that the contact member 190e may be electrically connected with external devices.

At least one among the buffer layer 120, the second insulating layer 160, the third insulating layer 181, and the fourth insulating layer 182 may include an inorganic insulating material such as a silicon nitride (SiNx), a silicon oxide (SiOx), and a silicon oxynitride (SiON), and/or an organic insulating material. Particularly, the fourth insulating layer 182 may include the inorganic insulating material and/or the organic insulating material such as a polyimide, acryl-based polymer, a siloxane-based polymer, or the like, and may have a substantially flat upper surface.

On the fourth insulating layer 182, a pixel electrode layer including a plurality of pixel electrodes 191a, 191b, and 191c may be disposed as a fifth conductive layer. Each pixel electrode 191a, 191b, and 191c may be disposed corresponding to each pixel PX1, PX2, and PX3, as shown in FIG. 2. A planar size and shape of the pixel electrodes 191a, 191b, and 191c disposed in three neighboring pixels PX1, PX2, and PX3 may differ from each other, but this is not limitative. For example, in the three pixels PX1, PX2, and PX3, the planar size of the pixel electrode 191b, the pixel electrode 191a, and the pixel electrode 191c may be reduced in that order. In this case, the pixel PX2 may represent green, the pixel PX1 may represent red, and the pixel PX3 may represent blue.

Each pixel electrode 191a, 191b, and 19c may be in contact with each contact member (the contact member) 190a, 190b, and 190c through the contact hole 83b and electrically connected to the capacitor electrode 175 through the contact members 190a, 190b, and 190c. Accordingly, each pixel electrode 191a, 191b, and 191c is electrically connected to the drain region 135a of the first transistor T1, thereby receiving the voltage from the first transistor T1.

The pixel electrode layer may include a semitransparent conductive material or a reflective conductive material.

The fifth insulating layer 350 may be disposed on the fourth insulating layer 182. The fifth insulating layer 350 has an opening 355 disposed on the pixel electrodes 191a, 191b, and 191c. The fifth insulating layer 350 may include the organic insulating material such as a polyacryl-based resin or a polyimide resin.

An emission layer 370 is disposed on the fifth insulating layer 350 and the pixel electrode layer. The emission layer 370 may include a part disposed in the opening 355 of the fifth insulating layer 350. The emission layer 370 may include an organic light emission material or an inorganic light emission material. Alternatively, at least part of the fifth insulating layer 350 need not be covered by the emission layer 370.

The fifth insulating layer 350 and the emission layer 370 may include a contact hole 82 disposed on the contact member (the contact member) 190d.

A common electrode 270 is disposed on the emission layer 370. The common electrode 270 may be formed continuously across the plurality of pixels PX1, PX2, and PX3. The common electrode 270 can be electrically connected to the common voltage line 170 by being in contact with the contact members 190d through the contact hole 82, thereby receiving the common voltage ELVSS.

The common electrode 270 may include a conductive transparent material.

The pixel electrodes 191a, 191b, and 191c, the emission layer 370, and the common electrode 270 of each pixel PX1, PX2, and PX3 together form the light emitting diode (LED) ED, and either the pixel electrodes 191a, 191b, and 191c or the common electrode 270 becomes the cathode, and the other becomes the anode. An example in which the pixel electrodes 191a, 191b, and 191c become the anode was described.

Referring to FIG. 2, the lower pattern 111a may further include an extension portion 111aa overlapping the driving voltage lines 172a and the driving voltage patterns 172c and 172d in a plan view. Accordingly, the plane size of the lower pattern 111a may be larger than the plane size of the lower pattern 111b or the lower pattern 111c. According to the present exemplary embodiment, the lower pattern 111a is electrically connected to the pixel electrodes 191a, 191b, and 191c as the anode via the capacitor electrode 175, and the extension portion 111aa of the lower pattern 111a. overlaps the driving voltage line 172a and the driving voltage patterns 172c and 172d transmitting a predetermined voltage. The buffer layer 120 and the second insulating layer 160 are disposed between the extension portion 111aa of the lower pattern 111a and the driving voltage line 172a, thereby forming a capacitor Ced that serves to reinforce a function of maintaining the voltage of the anode.

The extension portion 111aa may also overlap the source region 133a of the active pattern 130a connected to the driving voltage line 172a.

On the other hand, the lower pattern 111a is electrically connected to the pixel electrodes 191a, 191b, and 191c through the capacitor electrode 175 and also overlaps the channel region 134a of the first transistor T1 a current variation rate is reduced in a saturation region of a voltage-current characteristic graph of the first transistor T1 so that a range of a region where the output current of the first transistor T1 is constant may be widened. Therefore, even if there is a change in the source-drain voltage Vds of the first transistor T1, the output current of the first transistor T1 is kept constant, thereby improving the output saturation characteristic. Thus, the luminance deviation between the pixels due to the output current of the first transistor T1 is reduced, thereby improving the image quality.

Referring to FIG. 6, the present exemplary embodiment is substantially the same as the structure shown in FIG. 5. For the convenience of description, only the differences will be described. The fourth insulating layer 182 may further include a contact hole 81a disposed on the contact member 190d, and the pixel electrode layer may further include a contact member 191d in contact with the contact member 190d through the contact hole 81a. Accordingly, the fifth insulating layer 350 and the emission layer 370 may include the contact hole 82a disposed on the contact member 191d. The common electrode 270 is in contact with the contact member 191d via the contact hole 82a to be electrically connected to the common voltage line 170, thereby receiving the common voltage ELVSS.

Figure 7:
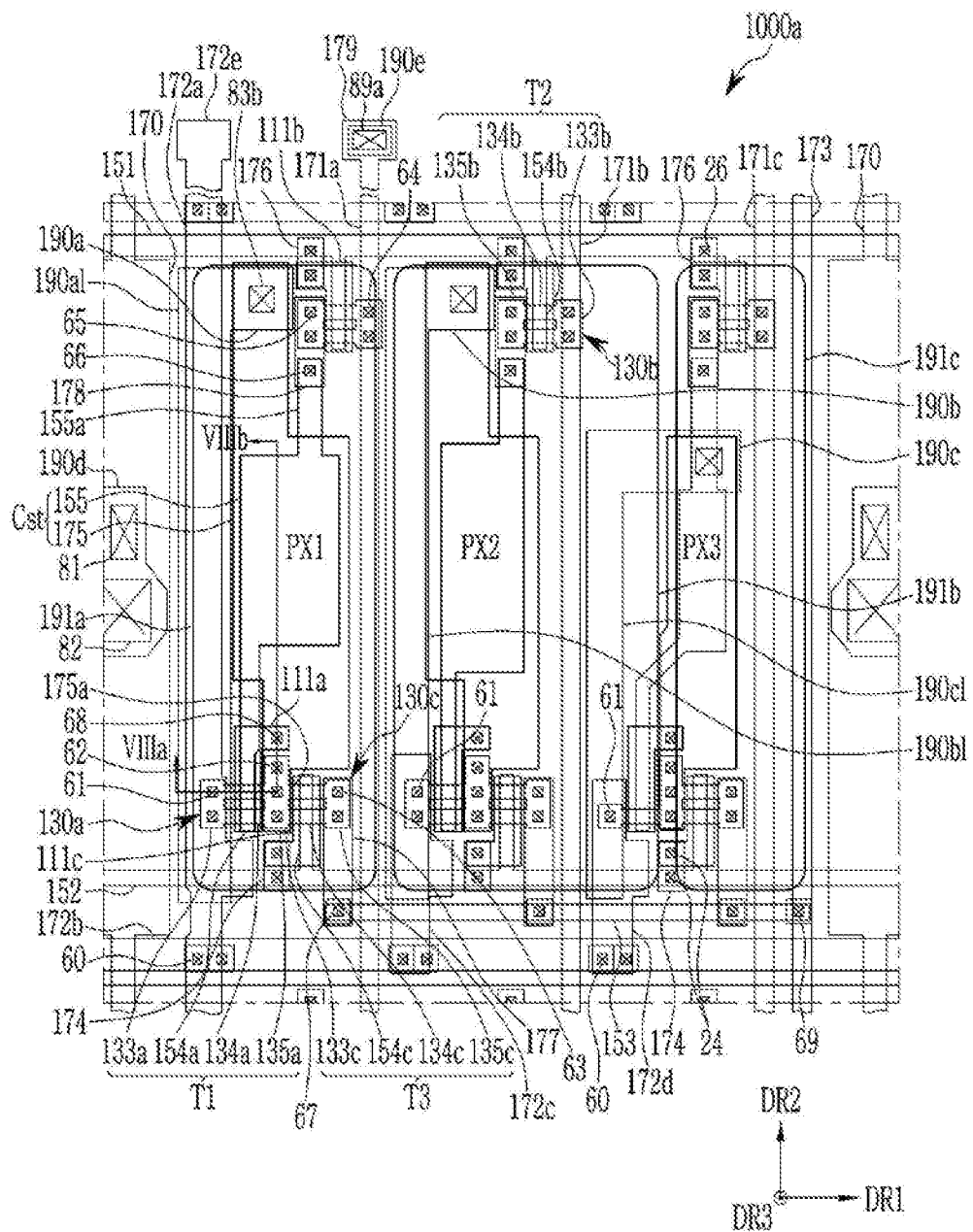
FIG. 7 is a plane layout view of a plurality of pixels of a display device according to an exemplary embodiment.
Figure 8:
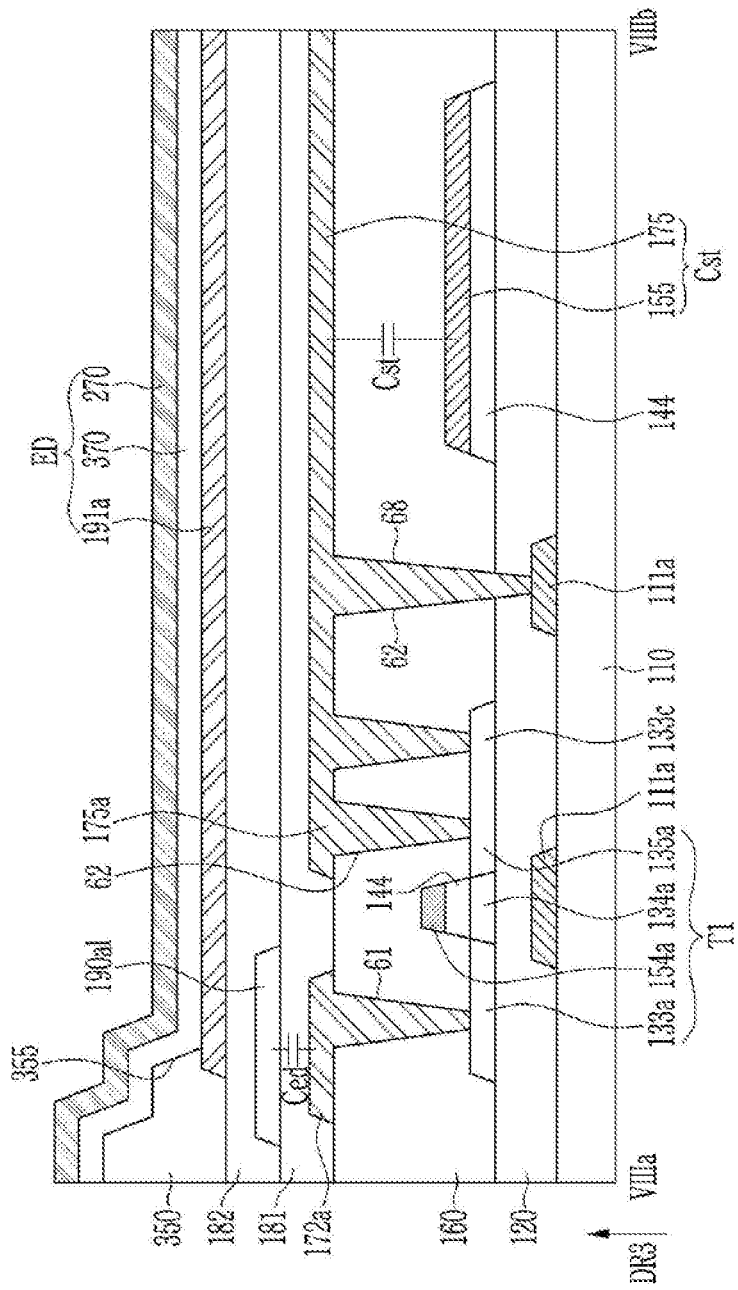
FIG. 8 is a cross-sectional view of a display device shown in FIG. 7 taken along line VIIIa-VIIIb.
Figure 9:
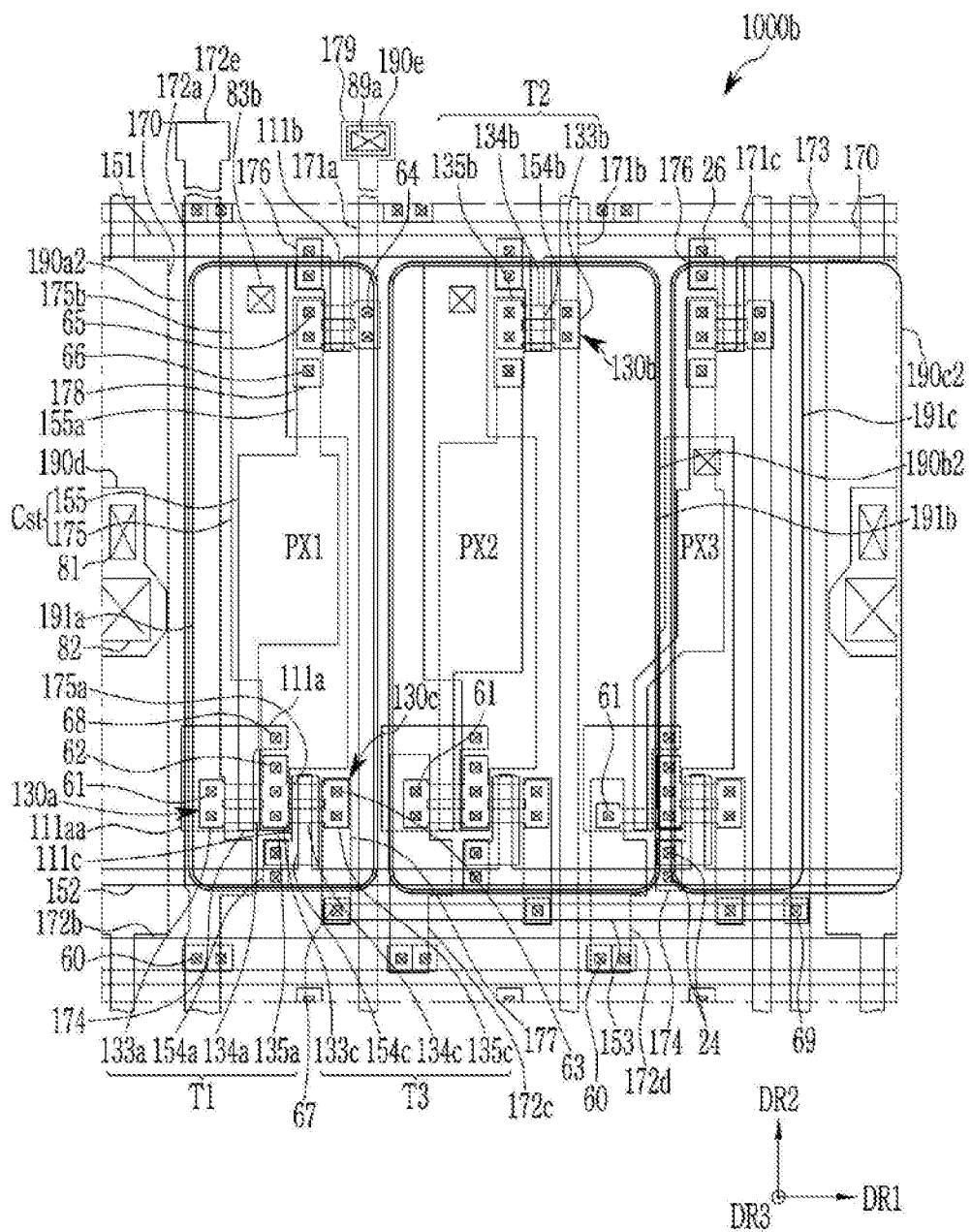
FIG. 9 is a plane layout view of a plurality of pixels of a display device according to an exemplary embodiment.

Next, a display device 1000a according to an exemplary embodiment will be described with reference to FIG. 7 to FIG. 9 along with the above-described drawings. The exemplary embodiment shown in FIG. 7 to FIG. 9 is different from the above-described exemplary embodiments shown in FIG. 2 to FIG. 6, and for convenience, the same reference numerals are used for the corresponding constituent elements, and although the function of the corresponding constituent elements may be the same, the plane or cross-sectional structure may differ slightly. This applies equally to the other subsequent drawings.

FIG. 7 is a plane layout view of a plurality of pixels of a display device according to an exemplary embodiment, and FIG. 8 is a cross-sectional view of a display device shown in FIG. 7 taken along line VIIIa-VIIIb.

Referring to FIG, 7 and FIG. 8, the display device 1000a according to an exemplary embodiment is substantially the same as most of the display device 1000 according to the above-described exemplary embodiment, however the fourth conductive layer may further include extension portions 190a1, 190b1, and 190c1 connected to the contact members 190a, 190b, and 190c. In other words, the contact members 190a, 190b, and 190c may include the extension portions 190a1, 190b1, 190c1.

Each extension portion 190a1, 190b1, and 190c1 overlaps the driving voltage line 172a disposed in a first pixel PX1 and the driving voltage patterns 172c and 172d disposed in a second pixel PX2. The contact members 190a, 190b, and 190c are disposed in the pixels PX1, PX2 and PX3, respectively. The extension portion 190c1 is extended from the contact member 190c into the third pixel PX3 along the first direction DR1 and then is further extended within the second pixel PX2 along the second direction DR2. The third insulating layer 181 is disposed between the extension portion 190a1 of the contact member 190a and the driving voltage line 172a to form the hold capacitor Ced that may serve to reinforce the function of maintaining the voltage of the anode of the light emitting diode (LED) ED. Similarly, the extension portion 190b1 and the driving voltage pattern 172c may form a hold capacitor Ced for the LED ED for the second pixel PX2; and the extension portion 190c1 and the driving voltage pattern 172d may form a hold capacitor Ced for the LED ED for the second pixel PX3.

Each extension portion 190a1, 190b1, 190c1 may be extended in the second direction DR2 to overlap the driving voltage line 172a and the driving voltage patterns 172c and 172d, respectively.

FIG. 9 is a plan layout view for a plurality of pixels PX1, PX2, and PX3 of a display device according to an exemplary embodiment.

Referring to FIG. 9, a display device 1000b according to the present exemplary embodiment is substantially the same as most of the display devices 1000 and 1000a according to various exemplary embodiments described above, but the fourth conductive layer may include extended contact members 190a2, 190b2, and 190c2 formed entirely in each pixel PX1, PX2, and PX3 instead of including the contact members 190a, 190b, and 190c. That is, each extended contact member 190a2, 190b2, and 190c2 may not only overlap the driving voltage line 172a and the driving voltage patterns 172c and 172d disposed in each pixel PX1, PX2, and PX3 via the third insulating layer 181, but may also overlap other regions of each pixel PX1, PX2, and PX3. For example, as shown in FIG. 9, each extended contact member 190a2, 190b2, and 190c2 may overlap most of the pixel electrodes 191a, 191b, and 191c of the corresponding pixels PX1, PX2, and PX3 and may have a similar shape to each pixel electrode 191a, 191b, and 191c. Each extended contact member 190a2, 190b2, and 190c2 may also overlap the driving gate electrode 155, the capacitor electrode 175, and the like of the corresponding pixels PX1, PX2, and PX3, or furthermore, may overlap at least part among the transistors T1, T2, and T3. The extended contact member 190c2 of the pixel PX3 may overlap the adjacent common voltage line 170.

In the exemplary embodiment shown in FIG. 7 to FIG. 9, the lower pattern 111a may or need not include the extension portion 111aa, unlike the above exemplary embodiment. FIG. 7 and FIG. 8 show an example without the extension portion 111aa, and FIG. 9 shows an example including the extension portion 111aa.

Figure 10:
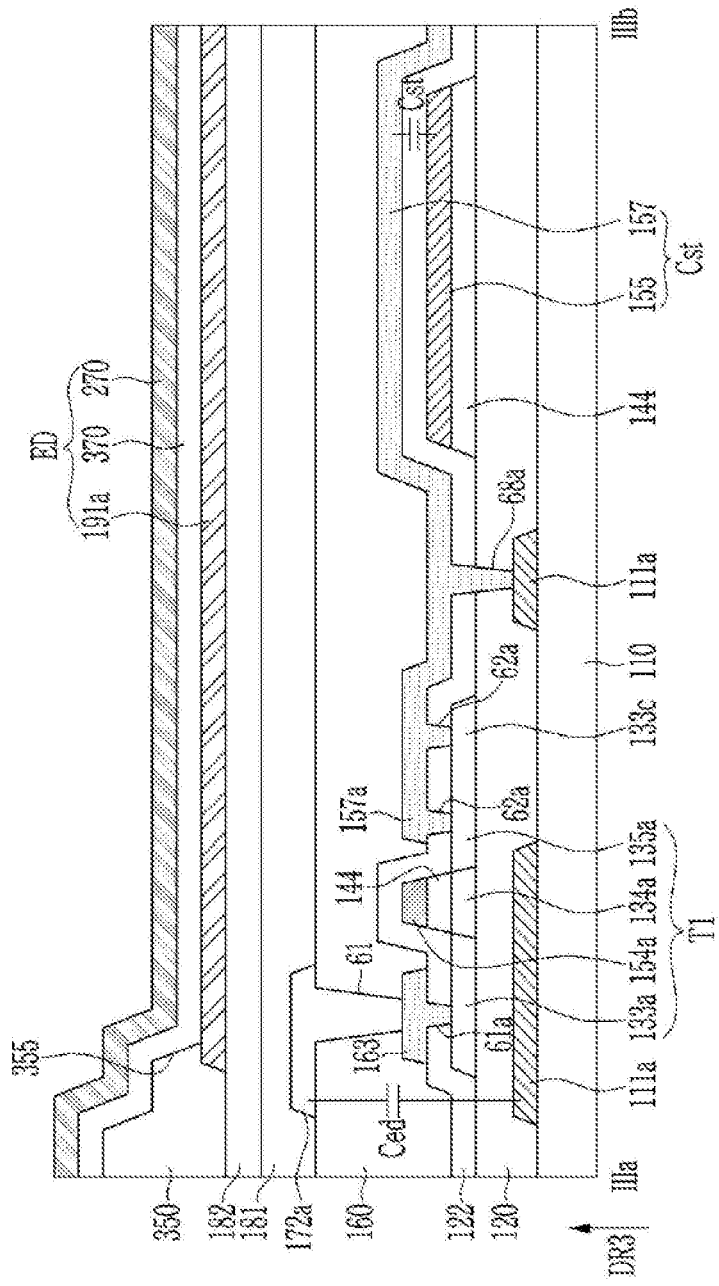
FIG. 10 and FIG. 11 are cross-sectional views of a display device shown in FIG. 2 taken along line IIIa-IIIb, respectively.

Next, the display device according to an exemplary embodiment is described with reference to FIG. 10, FIG. 10 is another example of the cross-sectional view of the display device shown in FIG. 2 taken along line IIIa-IIIb.

Referring to FIG. 10, the display device according to an exemplary embodiment is substantially the same as most of the above-described exemplary embodiments, except for a sixth insulating layer 122 disposed on the second conductive layer and the buffer layer 120 and a sixth conductive layer disposed between the sixth insulating layer 122 and the second insulating layer 160.

The sixth insulating layer 122 may be in contact with the top surfaces of the conductive regions of the active patterns 130a, 130b, and 130c. The sixth insulating layer 122 may include a contact hole 61a and contact holes 62a and 68a. The contact hole 61a overlaps the contact hole 61 of the second insulating layer 160.

In the present exemplary embodiment, instead of including the above-described capacitor electrode 175, a capacitor electrode 157 positioned in the sixth conductive layer may be included. The capacitor electrode 157 may be electrically connected to the drain region 135a of the active pattern 130a via the contact hole 62a and may be electrically connected to the lower pattern 111a via the contact hole 68a. The capacitor electrode 157 may have a similar planar shape to that of the capacitor electrode 175 described above. The capacitor electrode 157 may overlap the majority of the corresponding driving gate electrode 155. The sixth insulating layer 122 may be disposed therebetween to form a storage capacitor Cst.

The sixth conductive layer may further include a connection pattern that is in contact with the underlying conductive layer via a contact hole. For example, referring to FIG. 10, the sixth conductive layer includes a connection pattern 163 that is in contact with the source region 133a of the active pattern 130a through the contact hole 61a, and the driving voltage line 172a is in contact with and is electrically connected to the connection pattern 163 through the contact hole 61 of the second insulating layer 160 to be electrically connected to the source region 133a of the active pattern 130a.

Next, the display device according to an exemplary embodiment is described with reference to FIG. 11.

Figure 11:
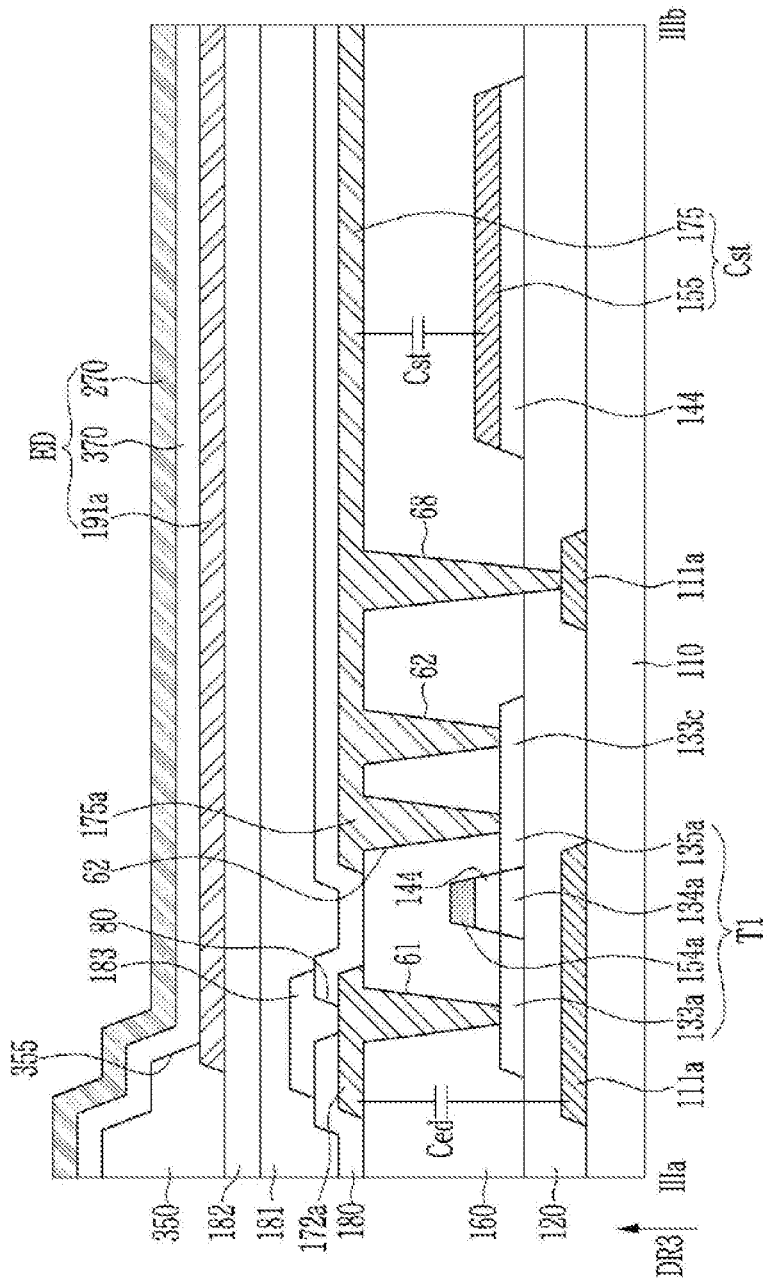

FIG. 11 is another example of the cross-sectional view of the display device shown in FIG. 2 taken along line IIIa-IIIb.

Referring to FIG. 11, the display device according to an exemplary embodiment is substantially the same as most of the above-described exemplary embodiments except for a seventh insulating layer 180 disposed between the third conductive layer and the third insulating layer 181, and a seventh conductive layer disposed between the seventh insulating layer 180 and the third insulating layer 181.

The seventh conductive layer may include conductive patterns extending almost parallel to the pattern such as the data lines 171a, 171b, and 171c, the driving voltage line 172a, the common voltage line 170, the initialization voltage line 173, and the like, which are disposed in the underlying third conductive layer to be electrically connected. For example, referring to FIG. 11, the seventh conductive layer may further include a conductive pattern 183 electrically connected to the driving voltage line 172a via a contact hole 80 of the seventh insulating layer 180. In a plan view, the conductive pattern 183 may have a planar shape similar to the third conductive layer, which is generally connected to the conductive pattern 183. The conductive pattern 183 may serve to lower the resistance by transmitting the same voltage as the third conductive layer that is connected thereto.

Alternatively, the part among the data lines 171a, 171b, and 171c, the driving voltage line 172a, the common voltage line 170, the initialization voltage line 173, the capacitor electrode 175, the connecting members 174, 176, 177, and 178, and the plurality of driving voltage patterns 172c and 172d of the third conductive layer may be disposed in the third conductive layer, and the rest of them may be disposed in the seventh conductive layer.

Next, a display device 1000c according to an exemplary embodiment is described with reference to FIG. 12 and FIG. 13 along with the above-described drawings.

Figure 12:
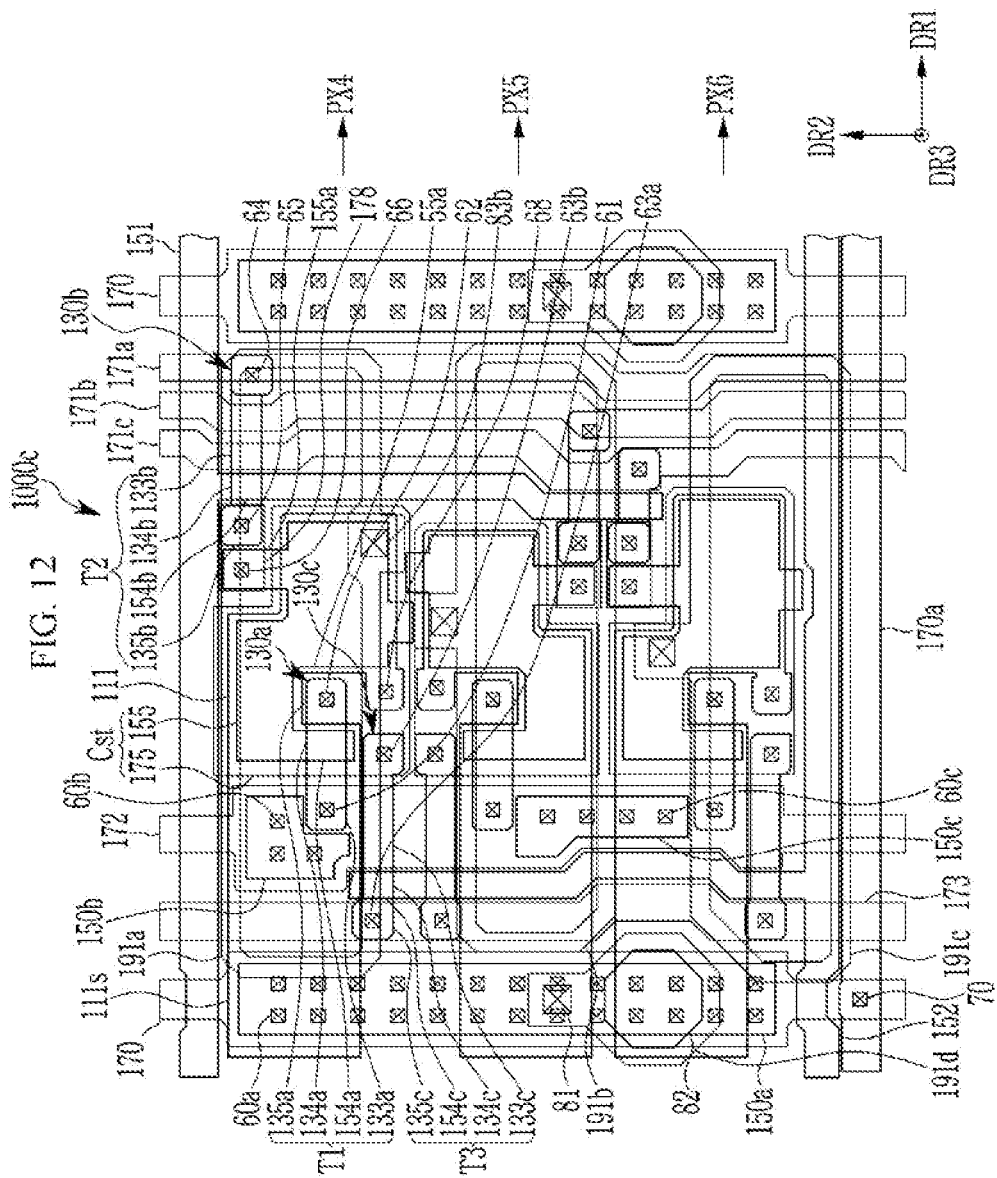
FIG. 12 and FIG. 13 are plan layout views of a plurality of pixels of a display device according to an exemplary embodiment, respectively.
Figure 13:
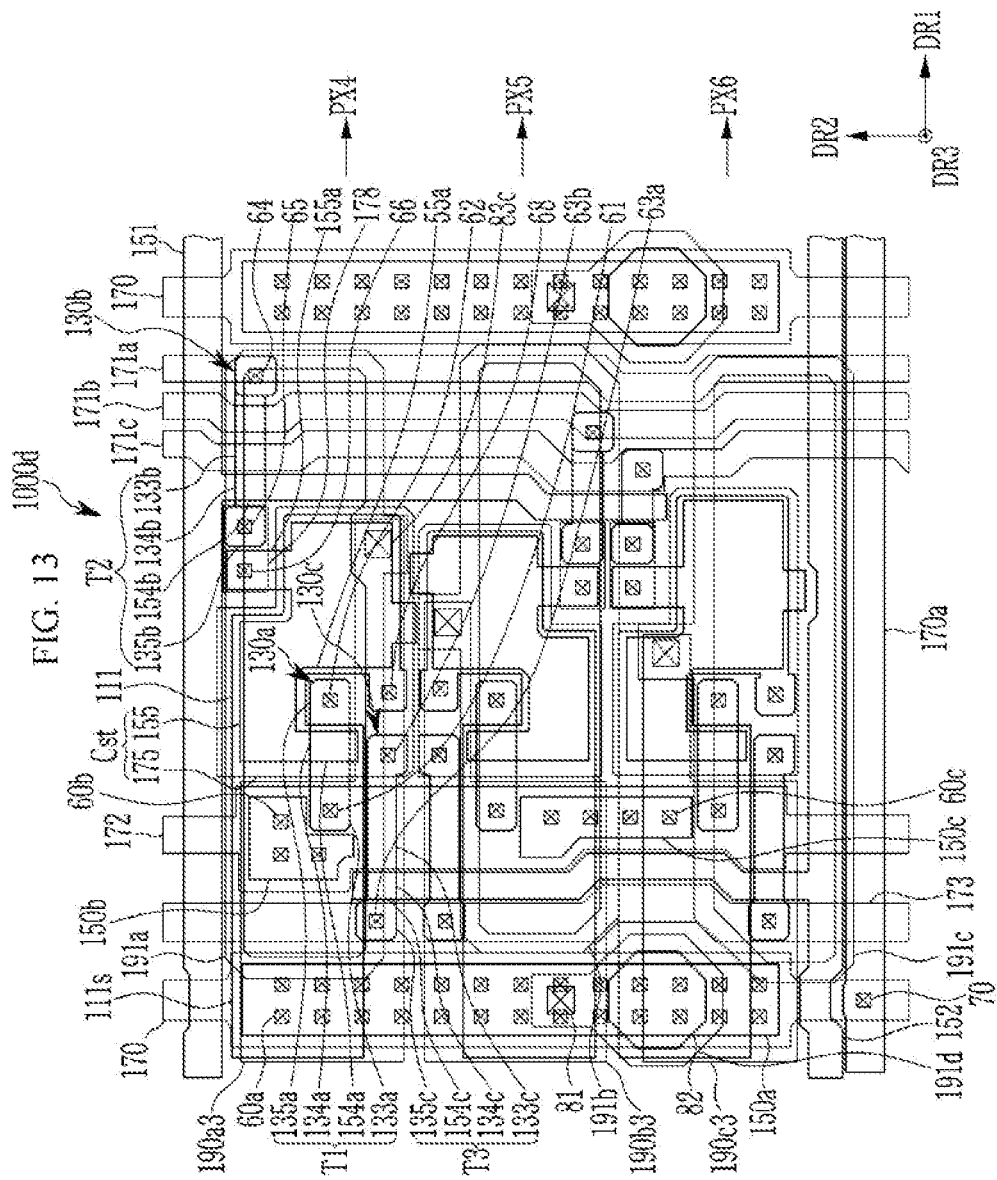

FIG. 12 and FIG. 13 are plane layout views of a plurality of pixels PX4, PX5, and PX6 of a display device according to an exemplary embodiment, respectively.

First, referring to FIG. 12, the connection relationship and the stacked structure of the constituent elements of the display device 1000c according to an exemplary embodiment are substantially the same as most of the display devices 1000, 1000a, and 1000b according to the above-described exemplary embodiments, however the detailed shape and connection method of the constituent elements may be different. Differences from the previous exemplary embodiments are focused on.

A plurality of pixels PX4, PX5, and PX6 of a repeated group may be arranged adjacent to one another in the second direction DR2.

The pixels PX4, PX5, and PX6 of one column may be disposed between two adjacent common voltage lines 170, and a plurality of data lines 171a, 171b, and 171c may be disposed between the pixels PX4, PX5, and PX6 of one column and the common voltage line 170 of one side. Also, the driving voltage line 172 and the initialization voltage line 173 may be disposed between the pixels PX4, PX5, and PX6 of one column and the common voltage line 170 of the other side. That is, a plurality of data lines 171a, 171b, and 171c may be disposed on one side with respect to the pixels PX4, PX5, and PX6 of the one column, while the driving voltage line 172 and the initialization voltage line 173 may be disposed on the other side.

The first scan line 151 and the second scan line 152 may be disposed below and above the plurality of pixels PX4, PX5, and PX6 of the repeated group, respectively.

The first conductive layer described above may include a plurality of lower patterns 111, and each lower pattern 111 may be disposed in each of the pixels PX4, PX5, and PX6. The first conductive layer may further include a transverse common voltage line 170a extending approximately in the first direction DR1.

The active patterns 130a, 130b, and 130c disposed in the active layer may include the channel regions 134a, 134b, and 134c forming each channel of the transistors T1, T2, and T3, and the source regions 133a, 133b, and 133c and the drain regions 135a, 135b, and 135c. In the present exemplary embodiment, in each pixel PX4, PX5, and PX6, the active pattern 130a, the active pattern 130b, and the active pattern 130c may be separated from each other.

The second conductive layer may include the first scan line 151, the second scan line 152, the driving gate electrode 155, the second gate electrode 154b, the third gate electrode 154c, and the like. Each of the first and second scan lines 151 and 152 may extend in the first direction DR1. Each driving gate electrode 155 may be disposed corresponding to each pixel PX4, PX5, and PX6. The plurality of second gate electrodes 154b corresponding to the plurality of pixels PX4, PX5, and PX6 are connected to each other, and form the shape extending in the second direction DR2 as a whole, thereby extending toward the second scan line 152. The plurality of third gate electrodes 154c corresponding to a plurality of pixels PX4, PX5, and PX6 are connected to each other, and form the shape extending in the second direction DR2 as a whole, thereby extending toward the first scan line 151.

The driving gate electrode 155 disposed at each pixel PX1, PX2, and PX3 may include the first gate electrode 154a of the shape protruding above or below. The first gate electrode 154a crosses the active pattern 130a and overlaps the channel region 134a of the active pattern 130a. The second gate electrode 154b crosses the active pattern 130b and overlaps the channel region 134b of the active pattern 130b. The third gate electrode 154c crosses the active pattern 130c and overlaps the channel region 134c of the active pattern 130c.

The third conductive layer may include the plurality of data lines 171a, 171b, and 171c, the driving voltage line 172, the common voltage line 170, the initialization voltage line 173, the capacitor electrode 175, and the plurality of connecting member 178 as above-described.

Each of the data lines 171a, 171b, and 171c, the driving voltage line 172, the common voltage line 170, and the initialization voltage line 173 extends approximately in the second direction DR2, thereby crossing the first and second scan lines 151 and 152.

Each data line 171a, 171b, and 171c is electrically connected to the source region 133b of the active pattern 130b through the contact hole 64. The driving voltage line 172 is electrically connected to the source region 133a of the active pattern 130a through the contact hole 61. The initialization voltage line 173 is electrically connected to the drain region 135c of the active pattern 130c via a contact hole 63a. The contact holes 61, 63a, and 64 may be formed in the second insulating layer 160 described above.

The capacitor electrode 175 may be disposed one by one on each pixel PX1, PX2, and PX3, and may be disposed between the driving voltage line 172 and the data line 171c. The capacitor electrode 175 overlaps most of the corresponding driving gate electrode 155 with the second insulating layer 160 therebetween to form a storage capacitor Cst.

The capacitor electrode 175 is electrically connected to the drain region 135a of the active pattern 130a through the contact hole 62 of the second insulating layer 160, and is electrically connected to the source region 133c of the active pattern 130c through a contact hole 63b of the second insulating layer 160. In addition, the capacitor electrode 175 is electrically connected to the lower pattern 111 through the contact hole 68 of the second insulating layer 160 and the buffer layer 120. The driving gate electrode 155 includes an opening 55a overlapping the contact hole 62 for the contact between the capacitor electrode 175 and the drain region 135a of the active pattern 130a so that the driving gate electrode 155 may have the shape enclosing the vicinity of the contact hole 62.

The connecting member 178 is electrically connected to the drain region 135b of the active pattern 130b through the contact hole 65 of the second insulating layer 160, and is electrically connected to the extension 155a of the driving gate electrode 155 through the contact hole 66 of the second insulating layer 160 in each pixel PX4, PX5, and PX6, such that the drain region 135b of the active pattern 130b and the extension 155a. of the driving gate electrode 155 may be electrically connected to each other.

The third insulating layer 181 may include the contact hole 83a disposed on the capacitor electrode 175, the contact hole 89a disposed on the end portion 179 of the data lines 171a, 171b, and 171c, and the contact hole 81 disposed on the common voltage line 170.

The display device 1000c according to the present exemplary embodiment may include the fourth conductive layer as described above.

The plurality of pixel electrodes 191a, 191b, and 191c disposed at the pixel electrode layer of the fifth conductive layer are disposed corresponding to each pixel PX4, PX5, and PX6. Each pixel electrode 191a, 191b, and 191c may be electrically connected to the capacitor electrode 175 through the contact hole 83b of the fourth insulating layer 182 as above-described. In this case, the contact members disposed in the fourth conductive layer may be disposed between each pixel electrode 191a, 191b, and 191c and the capacitor electrode 175. Each pixel electrode 191a, 191b, and 191c is electrically connected to the drain region 135a of the first transistor T1 via the capacitor electrode 175, thereby receiving the voltage from the first transistor T1.

The pixel electrode layer may further include the contact member 191d overlapping the common electrode 270 as described above. In addition, the fourth conductive layer may further include a contact member that is in contact with the contact member 191d. The common electrode 270 is electrically connected to the contact members 191d through the contact holes 82 and the contact members 191d is electrically connected to the common voltage line 170 through contact holes 81, thereby receiving the common voltage ELVSS. That is, the common electrode 270 may receive the common voltage ELVSS from the common voltage line 170 through contact members 191d.

The common voltage line 170 may be electrically connected to the transverse common voltage line 170a through the contact hole 70.

The second conductive layer may further include a conductive pattern 150a overlapping the common voltage line 170 and conductive patterns 150b and 150c overlapping the driving voltage line 172. In this case, the conductive pattern 150a may be electrically connected to the common voltage line 170 through a plurality of contact holes 60a of the second insulating layer 160 to reduce the resistance. The conductive patterns 150b and 150c may be electrically connected to the driving voltage line 172 through a plurality of contact holes 60b and 60c of the second insulating layer 160 to reduce the resistance.

The lower pattern 111 may further include an extension portion 111s overlapping at least one among the driving voltage line 172, the initialization voltage line 173, and the common voltage line 170. FIG. 12 shows an example in which the lower pattern 111 includes the extension portion 111s overlapping all of the driving voltage line 172, the initialization voltage line 173, and the common voltage line 170. Alternatively, the extension portion 111s may only overlap the driving voltage line 172 or may only overlap the driving voltage line 172 and the initialization voltage line 173 among the driving voltage line 172, the initialization voltage line 173, and the common voltage line 170.

According to the present exemplary embodiment, the extension portion 111s of the lower pattern 111 overlaps at least some of the driving voltage line 172, the initialization voltage line 173, and the common voltage line 170, and transmits the constant voltage, thereby forming the capacitor Ced that serves to reinforce the function of maintaining the voltage of the anode of the light emitting diode (LED) ED.

Next, referring to FIG. 13, a display device 1000d according to an exemplary embodiment further includes the fourth conductive laver. The fourth conductive layer may include a plurality of contact members 190a3, 190b3 and 190c3 positioned corresponding to each pixel PX4, PX5, and PX6. The contact members 190a3, 190b3, 190c3 may be in contact with and electrically connected to the capacitor electrode 175 via the contact hole disposed in the third insulating layer 181, and each pixel electrode 191a, 191b, and 191c may be in contact with and electrically connected to each contact member 190a3, 190b3, 190c3 via a contact hole 83c included in the fourth insulating layer 182.

The contact members 190a3, 190b3, 190c3 overlap at least one among the driving voltage line 172, the initialization voltage line 173, and the common voltage line 170 via the third insulating layer 181, thereby forming the capacitor Ced that serves to reinforce the function of maintaining the voltage of the anode of the light emitting diode (LED) ED. FIG. 13 shows an example in which the contact members 190a3, 190b3, 190c3 overlap all of the driving voltage line 172, the initialization voltage line 173, and the common voltage line 170. Alternatively, the contact members 190a3, 190b3, and 190c3 may overlap only the driving voltage line 172 or may overlap only the driving voltage line 172 and the initialization voltage line 173 among the driving voltage line 172, the initialization voltage line 173, and the common voltage line 170.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a substrate;
a lower pattern disposed on the substrate;
an active pattern disposed on the lower pattern, wherein the active pattern includes a first region, a channel region, and a second region, the channel region disposed in a space between the first region and the second region, either the first region or the second region is a source region, and the other is a drain region, the channel region of the active pattern overlaps the lower pattern in a plan view, and the lower pattern prevents external light from reaching the channel region;
a driving voltage line disposed in a first layer on the active pattern and directly connected to the first region of the active pattern via a contact hole exposing the active pattern, wherein the driving voltage line overlaps the active pattern and the lower pattern, wherein the driving voltage line and the lower pattern form a first capacitor;
a pixel electrode connected to the second region of the active pattern and the lower pattern; and
a first capacitor electrode disposed in the first layer and separated from the driving voltage line,
wherein the first capacitor electrode is electrically connected to the lower pattern and the pixel electrode.

2. The display device of claim 1, further comprising:
a gate electrode overlapping the channel region; and
a driving gate electrode electrically connected to the gate electrode,
wherein the first capacitor electrode is further electrically connected to the second region, and the first capacitor electrode overlaps the driving gate electrode to form a second capacitor.

3. The display device of claim 2, further comprising:
a first scan line and a second scan line extending in a first direction and crossing the driving voltage line, and
the gate electrode is disposed between the first scan line and the second scan line in the plan view.

4. The display device of claim 2, further comprising:
a data line separated from the driving voltage line; and
a first contact member disposed on an end portion of the data line and in contact with the end portion.

5. The display device of claim 4, further comprising:
a second contact member disposed between the pixel electrode and the first capacitor electrode and in contact with the pixel electrode and the first capacitor electrode.

6. The display device of claim 5,
wherein the second contact member includes an extension portion overlapping the driving voltage line in the plan view.

7. The display device of claim 6,
wherein the extension portion overlaps the gate electrode and the first capacitor electrode.

8. The display device of claim 5, further comprising:
a common voltage line for transmitting a common voltage and an initialization voltage line for transmitting an initialization voltage, wherein the second contact member overlaps at least one among the driving voltage line, the initialization voltage line, and the common voltage line.

9. The display device of claim 2, further comprising:
a second capacitor electrode electrically connected to the lower pattern,
wherein the second capacitor electrode overlaps the gate electrode to form a third capacitor.

10. The display device of claim 1,
wherein the lower pattern overlaps the first region in the plan view.

11. The display device of claim 1, further comprising:
a common voltage line for transmitting a common voltage and an initialization voltage line for transmitting an initialization voltage,
wherein the lower pattern includes an extension portion overlapping at least one among the driving voltage line, the initialization voltage line, and the common voltage line.

12. A display device comprising:
a first scan line and a second scan line;
a driving gate electrode disposed between the first scan line and the second scan line;
a data line, a driving voltage line, an initialization voltage line, and a common voltage line crossing the first and second scan lines;
a first transistor electrically connected to the driving voltage line and the driving gate electrode, wherein the driving gate electrode serves as a gate electrode of the first transistor and the driving voltage line is connected to a source region of the first transistor;
a second transistor electrically connected to the first scan line and the data line;
a third transistor electrically connected to the second scan line, the first transistor, and the initialization voltage line;
a capacitor electrode electrically connected to a drain region of the first transistor;
a light emitting diode (LED) including a pixel electrode that is electrically connected to the capacitor electrode; and
a lower pattern overlapping a channel region of the first transistor in a plan view,
wherein the lower pattern is electrically connected to the capacitor electrode,
wherein the lower pattern is positioned lower than an active pattern of each of the first to third transistors, and
wherein the lower pattern overlaps at least one among the driving voltage line and the initialization voltage line in the plan view to form a first capacitor.

13. The display device of claim 12,
wherein the driving gate electrode and the capacitor electrode overlap each other in the plan view to form a second capacitor.

* * * * *